United States Patent [19]
Estrowitz et al.

[11] Patent Number: 6,126,995
[45] Date of Patent: Oct. 3, 2000

[54] PROCESS FOR PRODUCING STABLE DIVALENT SCANDIUM

[75] Inventors: Leon Estrowitz, Springfield; Charles Marquardt, Great Falls, both of Va.

[73] Assignee: The United States of America as represented by the Secretary of the Navy, Washington, D.C.

[21] Appl. No.: 08/940,740

[22] Filed: Sep. 30, 1997

[51] Int. Cl.[7] .................................................. C23C 14/24
[52] U.S. Cl. .................. 427/250; 427/255.21; 427/383.3
[58] Field of Search ..................... 427/250, 255, 427/383.3, 255.21; 372/39, 42

[56] References Cited

U.S. PATENT DOCUMENTS 3,836,387  9/1974  Roblin et al. ........................ 427/250
5,471,493  11/1995  Mirov et al. ........................ 372/42

*Primary Examiner*—Timothy Meeks
*Attorney, Agent, or Firm*—Barry A. Edelberg; Charles J. Stockstill

[57] ABSTRACT

A method for producing divalent scandium includes heating, at a mildly elevated temperature above 20° C. under reduced pressure, a calcium difluoride crystal sample doped with scandium trifluoride to drive off atmospheric impurities, heating at an intermediate temperature above 150° C. calcium metal under reduced pressure to drive off volatile impurities, heating calcium metal at a migrating below 900° C. to evaporate calcium and to deposit it on the sample, and heating the sample at a diffusion and reaction temperature below 950° C. to diffuse calcium into the sample and to cause formation of the divalent scandium.

16 Claims, 2 Drawing Sheets

PROCESS FOR PRODUCING STABLE DIVALENT SCANDIUM

BACKGROUND OF INVENTION

1. Field of Invention

This invention pertains to a process for preparing divalent scandium.

2. Description of Prior Art

There have been to date only three incontrovertible reports of having produced divalent scandium ($Sc^{2+}$) in calcium difluoride ($CaF_2$) crystals. These studies all identified the product as divalent scandium using the method of Electron Paramagnetic Resonance (EPR) in which divalent scandium exhibits a unique and unmistakable hyperfine structure. Several other reports have claimed to have produced this species, basing their claims on optical measurements. However, recent studies have demonstrated that these optical properties actually arise from other defects, and they cannot be used to demonstrate the presence of divalent scandium. In the three reports which employed EPR detection, two different methods were used to produce the divalent scandium species. In the earlier work, the following three step process was used: (1) scandium metal was evaporated onto the surface of a cleaved calcium difluoride crystal; (2) scandium metal deposited on the crystal was driven into bulk crystal by diffusion at high temperature; and (3) the crystal was subjected to ionizing radiation. Divalent scandium was detected only after the third step (ionizing radiation). In the more recent work, the doping was achieved by adding scandium trifluoride to the pure starting material prior to crystal growth and the trivalent scandium was then reduced to the divalent state by exposure to ionizing radiation, as in the earlier method.

Both prior art methods suffer from serious deficiencies. The doping technique employed in the earlier method limits the total scandium content to about 120 ppm or $3 \times 10^{18}$ per $cm^3$ or less. Only a small fraction of that total scandium is present in the divalent state, and much of it appears to remain as a metal colloid which causes a general optical darkening of the crystal. The more recent method produces optically clear samples but it also converts only a small fraction (typically $10^{-3}$) of the trivalent scandium to the divalent state. Furthermore, significant fading of this concentration occurs during dark storage at room temperature.

OBJECTS AND SUMMARY OF INVENTION

An object of this invention is conversion of trivalent scandium to divalent scandium in an amount of 50 times and more compared to prior art.

Another object of this invention is preparation of divalent scandium, the concentration of which does not decay measurably during periods of dark storage exceeding one year.

Another object of this invention is preparation of divalent scandium doped in a host that is not limited to trivalent dopant concentrations of less than 0.1%.

Another object of this invention is preparation of a host crystal doped with trivalent scandium and subsequent conversion of the trivalent scandium to divalent scandium without employing ionizing radiation.

Another object of this invention is the conversion of trivalent scandium to divalent scandium in a host crystal without causing a measurable general darkening of the host crystal.

Another object of this invention is the use of scandium-doped hosts to produce laser action in the ultraviolet/blue spectral region.

These and other objects of this invention are accomplished by a process of converting trivalent scandium to divalent scandium by purifying a host doped with a trivalent scandium is compound, evaporating an alkaline earth metal onto the host, and heating the host to cause the metal on the host to diffuse into the host and react with the host, thereby causing the trivalent scandium to convert to divalent scandium.

DESCRIPTION OF PREFERRED EMBODIMENTS

Figure 1:
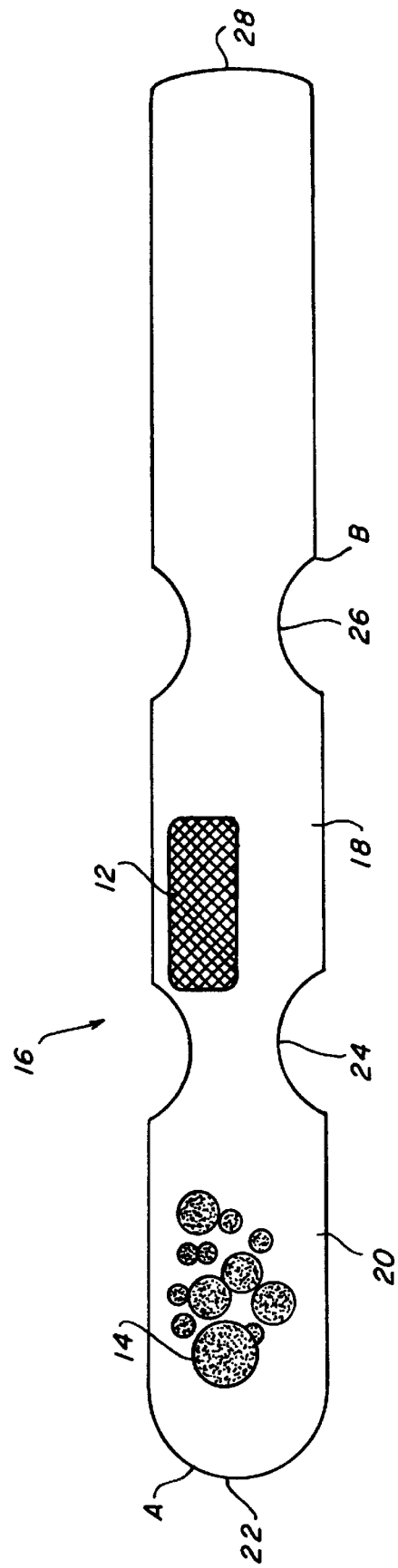
FIG. 1 schematically illustrates the apparatus and material used in the preparation of divalent scandium.

This invention is directed to a process for producing stable, high concentrations of divalent scandium exceeding $3 \times 10^{18}$ atoms per $cm^3$ in optically clear hosts.

The process is commenced with a host doped with a trivalent scandium compound. Any host with divalent cation sites is suitable, however, preferred hosts are selected from alkaline earth halides such as fluorides and chlorides; and colquirites such as $LiCaAlF_6$ (LICAF), $LiSrAlF_6$ (LISAF), and isomorphs thereof especially those isomorphs wherein gallium is substituted for aluminum. The cation of the host compound is selected from an alkaline earth such as beryllium, magnesium, calcium, strontium, barium, and mixtures thereof, especially calcium. For laser application, an especially preferred host is a compound which is strongly influenced by 3d electrons in parameters such as absorption bands, emission bands and gain cross section. The presence of a lone single electron in the valence band is attractive since that will minimize excited state absorption effects. An especially preferred host is the calcium difluoride crystal.

The dopant is a scandium compound of an anion and a scandium cation, wherein the scandium cation has a valence of +3. Since scandium atom has the electronic configuration of $1s^2\ 2s^2\ 2p^6\ 3s^2\ 3p^6\ 3d^1\ 4s^2$, a compound with a trivalent scandium cation is one in which the $3d^1\ 4s^2$ electrons of the scandium atom are lost to the anion of the compound. The preferred host is calcium difluoride, since calcium has an atomic radius similar to that of scandium due to its adjacent proximity in the Periodic Table. Thus, the preferred dopant is scandium trifluoride. It should be noted that the preferred host and the preferred dopant are chosen to have similar cation radii and identical anions. This enhances the incorporation of the scandium cation into a host lattice site, and it facilitates making the scandium conversion from the trivalent to the divalent state. The host and dopant are selected on the basis of promoting the conversion of trivalent to divalent scandium.

The amount of a dopant in the host can vary greatly. For a particular application, the minimum useful dopant concentration is determined by the minimum amount of divalent scandium that produces the desired effect. For lasing, for instance, the minimum useful dopant concentration is that amount of trivalent scandium which, after fractional conversion to the divalent state, will produce the lasing action. It is estimated that the minimum amount of divalent scandium useful for a laser application is about $10^{18}$–$10^{20}$ divalent scandium cations per $cm^3$. The maximum amount of a dopant is that amount which can be incorporated into the host without substantial deterioration of the properties of the doped host, as by precipitation. Generally speaking, amount of dopant in the host can be 0.05–3%, preferably 0.5–1.5%, and especially about 1%, based on the weight of the host and the dopant.

The host is normally in the form of a crystal doped with a suitable dopant. The host crystal is usually made by mixing a high purity particulate host material with a high purity particulate dopant material and then forming the doped host crystal. The doped host crystal can be formed, for example, by the Bridgman-Stockbarger method, ion implantation and other methods. The particular growth method is not critical.

The Bridgman-Stockbarger method of a growing calcium difluoride consists in melting the materials under vacuum in a vertical graphite crucible located in the hot zone of a furnace such that the liquid/solid interface is at the bottom of the crucible. With crucibles of appropriate shape at the bottom, the host crystal is grown by slowly lowering the crucible out of the hot zone so that the crystal solidifies or grows from the bottom towards the top. The use of seeds in seed cavities at the bottom of the crucible allows growth along a preferred crystal axis. Since contamination by oxygen or moisture leads to the nucleation of impurity oxides with resultant scatter, the host crystals are grown in a vacuum environment, usually with the addition of an oxygen "getter" which is subsequently lost through evaporation during the growth process, thereby removing oxygen-based impurities.

The furnace is electrically heated using graphite heating elements. A major commercial advantage of this method for host growth is that large crystals of high optical quality can be grown with the use of relatively inexpensive crucibles.

The doped host crystals can be obtained from a number of commercial sources in the form of rod-shaped doped "boules" of varying size, generally having circular cross-section. The boules are typically cleaved along the cleavage planes having their surface normally as close as possible to the growth axis. This produces samples of slightly ellipsoidal cross section and of any desired thickness, normally 2–3 mm. These crystal samples are then subjected to a multi-step heat treatment in order to convert as much of the trivalent scandium to divalent scandium as possible while avoiding deterioration of the optical quality of the crystal samples due to colloid formation.

The geometric configuration of a doped host crystal sample varies depending on the particular application. For most laser applications, the doped crystal sample has a high aspect ratio, with length being many times its cross sectional width. For laser applications involving divalent scandium, it is expected that length of the host crystal sample will be 2–10 times its width, with dimensions of 5–20 mm in length and 1–5 mm in width.

Conversion of trivalent scandium to divalent scandium by the heat treating process disclosed herein is very high in comparison to the prior art processes. Although the conversion of up to 5% has already been achieved, this is not an upper limit on the process. It is expected that higher conversions can be attained. Taking into account the various parameters involved, conversion of trivalent to divalent scandium of at least 10% should be possible.

Starting with a doped host crystal sample and a metal corresponding to the cation of the host compound, the process for converting at least a portion of trivalent scandium in the doped host crystal to divalent scandium includes purification of the doped host and the metal, evaporation of the alkaline earth metal and deposition thereof on the doped host, diffusion of the alkaline earth metal disposed on the doped host into the host whereby the conversion from trivalent to divalent scandium takes place, and cooling the doped host after the conversion.

Pursuant to the process disclosed herein, purification of the doped host and the alkaline earth metal takes place in two interconnected chambers under a reduced pressure below atmospheric pressure, preferably under a vacuum. The purpose of the first purification step is to drive-off adsorbed moisture and other atmospherics. This is accomplished by heating both the doped host and the metal to a mildly elevated temperature until the adsorbed moisture and other atmospheric impurities are driven off. Removing the atmospheric impurities can usually be accomplished under vacuum by heating the chamber, the doped host and the metal to a temperature of above 20° C., more typically 50–200° C. This mildly elevated temperature cannot be too low or too high if the object of removing atmospheric impurities is to be achieved. If the temperature is too low, it will be ineffective to remove the atmospheric impurities. If the temperature is too high, the metal may migrate onto the crystal surface prematurely, forming stable impurity compounds which cannot be removed by heating. At conditions conducive to removal of atmospheric impurities, removal of adsorbed moisture and other atmospheric impurities typically takes less than two hours, more typically from a few minutes to one hour. In the instance when a torch is used to remove the atmospheric impurities, the temperature is typically not quantified.

The alkaline earth metal, but not the crystal, is subsequently further purified by heating it under reduced pressure, preferably under vacuum, to an intermediate temperature above the mildly elevated temperature but below about 400° C. to remove the more tightly bound adsorbed impurities therefrom. The intermediate temperature also cannot be too low or too high since a temperature that is too low will be ineffective to remove the adsorbates, and a temperature that is too high may volatilize the metal and cause it prematurely to deposit on the doped host and other surfaces. The intermediate temperature is typically above 150° C., more typically 200–400° C. Removal of volatile impurities from the metal at the intermediate temperature takes less than two hours, more typically from a few minutes to less than one hour. If a torch is used to remove the volatile impurities, the temperature is typically not quantified.

Removal of volatile impurities is accompanied by an increase in pressure in the chamber within which the alkaline earth metal is disposed. As the adsorbates are volatilized during the purification step, pressure in the chamber temporarily increases until all the volatiles are conveyed out of the chamber by the pump. Removal of all or most of the volatile impurities can be determined by monitoring pressure in the chamber during this intermediate heating process. The chamber is closed off from the pump and hermetically sealed under vacuum when the original base pressure (i.e. the pressure prior to heating) has been re-established. When the chamber is sealed off from the outside atmosphere after removal of all or most of the volatile impurities, heating of the alkaline earth metal is typically discontinued.

With the doped host and the alkaline earth metal disposed in the chamber under reduced pressure, preferably under vacuum, the alkaline earth metal is heated to a "migration temperature" at which a very low vapor pressure is produced. Under these conditions, the metal migrates along the surfaces, depositing on the doped host crystal and also on the interior surfaces of the chamber. Not all surfaces of the doped host need to be coated with the alkaline earth metal, however, sufficient alkaline earth metal must be deposited on the doped host to provide sufficient number of electrons for the conversion of trivalent to divalent scandium, a conversion which requires one electron per each scandium cation.

The migration temperature to which the alkaline earth metal is heated to form metal vapor is below boiling temperature of the alkaline earth metal and above its melting temperature. The migration temperature should be high enough to cause the alkaline earth metal to migrate and deposit on the doped host. At the reduced pressure in the chamber, the migration temperature is typically below about 900° C., more typically 500–700° C., and deposition of the alkaline earth metal on the doped host is typically accomplished in less than two hours, more typically from a few minutes to one half hour after the migration temperature attainment. The migration temperature cannot be too low or too high since a temperature that is too low will be ineffective to vaporize the alkaline earth metal and cause its deposition on the doped host; and a temperature that is too high may cause explosion or other unforeseen problems, such as a reaction between the metal and the chamber.

After deposition of the alkaline earth metal on the doped host, the coated doped host is heated under reduced pressure to a diffusion and reaction temperature above the migration temperature but below the boiling temperature of the metal in order to diffuse some of the metal on the doped host thereinto. The diffusion temperature is typically below about 950° C., more typically 700–800° C.

After diffusing into the doped host, the alkaline earth metal, e.g., calcium, reacts therewith, releasing its electrons and converting the trivalent scandium to divalent scandium. Duration of diffusion and reaction is typically accomplished in a period of time of less than ten hours and more typically from a few minutes to two hours, while maintaining the diffusion and reaction temperature.

Since the metal is a divalent alkaline earth metal, each atom of the alkaline earth metal loses two electrons during reaction with the doped host after diffusion of the alkaline earth metal into the doped host, which two electrons react with two trivalent scandium cations to form two divalent scandium cations.

Following diffusion of the metal, the doped host is slowly cooled to the desired temperature, typically room temperature, over a period of several hours. The slow cooling is used to prevent cracking of the doped host. After cooling, the doped host is removed from the chamber and the black layer thereon, if present, is removed. The interior of the doped host is of a high optical quality, in the sense that it is free of colloidal absorption, as determined by spectrophotometry, and can be used in applications such as lasers; multi-wavelength interferometry; detection of chemical and biological species such as ozone, proteins, warfare agents, illicit drugs, and hazardous wastes; bio/chem diagnostics and x-ray lithography; and uv lithography.

Figure 2:
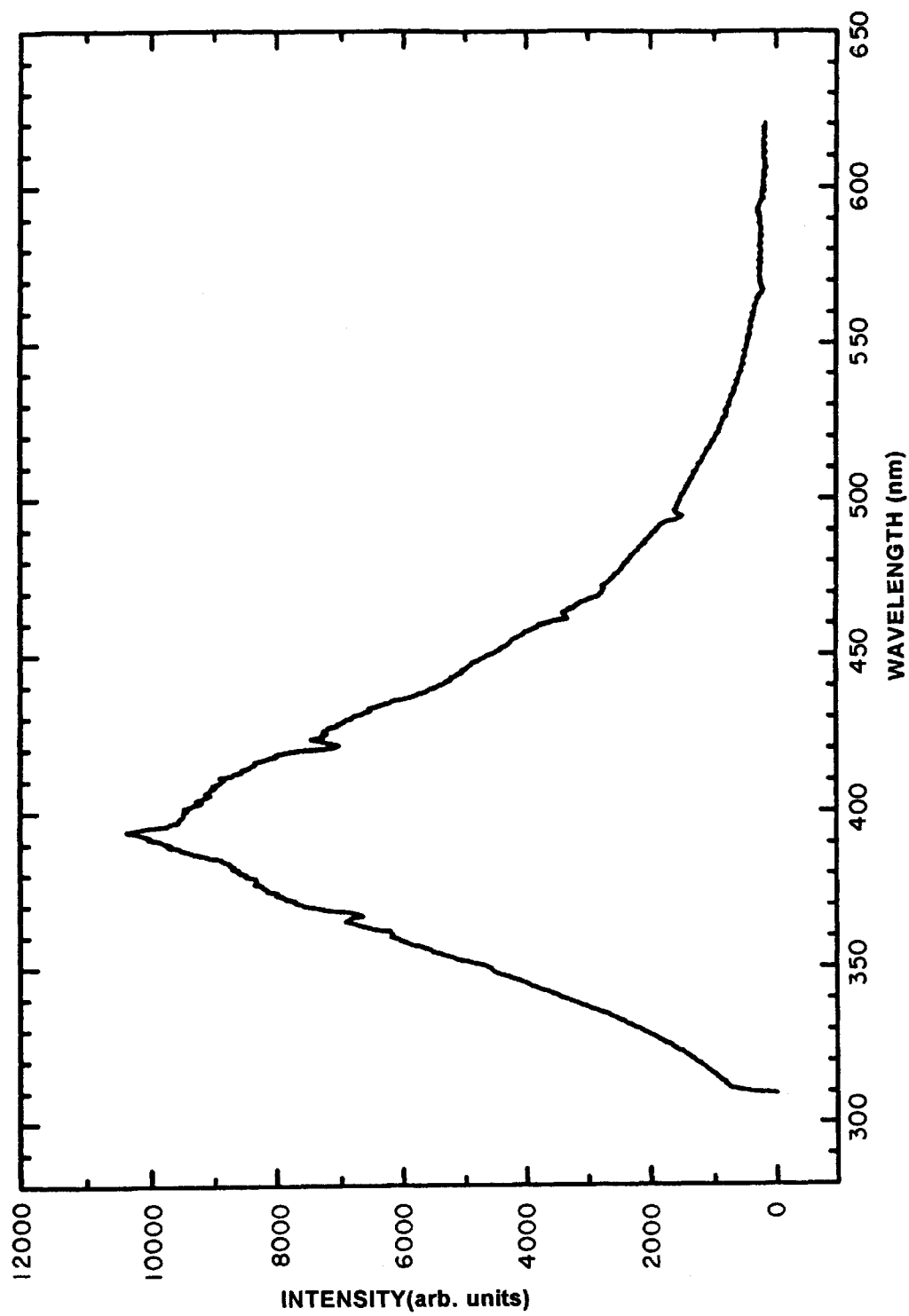
FIG. 2 is a plot showing fluorescence of a calcium difluoride host containing divalent scandium, under excitation by 193 nm pump light.

The use of the treated doped host in a laser permits laser operation in the wavelength range of 350 to 550 nm. FIG. 2 shows that fluorescence of a heat treated calcium difluoride host doped with 1% scandium trifluoride, based on the weight of the doped host, peaks at about 380 nm.

Having described the invention, the following example is given as a particular embodiment thereof and to demonstrate the practice and advantages thereof. It is understood that the example is given by way of illustration and is not intended to limit the specification or the claims in any manner.

EXAMPLE

This example demonstrates use of the apparatus of FIG. 1 together with a calcium difluoride crystal doped with scandium trifluoride in conjunction with the process for converting trivalent to divalent scandium.

Pursuant to the process disclosed herein, the doped host in the form of a sample 2 mm thick was cleaved from a 10 mm diameter calcium difluoride crystal boule that was about 150 mm long. The crystal boule was produced by a commercial crystal growth laboratory, using the Bridgman-Stockbarger method and 99.999% pure starting materials. The cross section of the sample was slightly ellipsoidal and the sample weighed about 0.5 gm. The sample was a calcium difluoride crystal doped with 0.3 weight percent of scandium trifluoride.

Referring to FIG. 1, sample 12 and about 1.5 grams of re-distilled calcium shot metal 14 of 99.5% purity were placed in a two-chamber tube 16 made from 14 mm I.D. fused silica tubing. Sample 12 was placed in chamber 18 open at both ends and calcium metal shot 14 was placed in chamber 20 open at one end and closed at the opposite end 22. Each chamber 18, 20 was about 75 mm long and the chambers were connected by constricted section or neckdown 24 about 5 mm in I.D. Another constriction section 26 was made in the tubing 16 (after inserting both the metal and the sample) at a point along the tubing away from constriction section 24, also about 5 mm in I.D. Tube 16 terminated at its open end at 28. The overall length of tubing 16 from point A to point B was about 150 mm.

When the materials were located in the tube, as shown in FIG. 1, open end 28 of tube 16 was connected to a vacuum system and the interior of the tube was evacuated to a reduced pressure of about $10^{-7}$ Torr, i. e., a moderately good vacuum. All parts of tube 16, sample 12 and metal 14 were heated gently to a mildly elevated temperature with a hydrogen gas torch in order to drive off absorbed moisture and other atmospherics. This took about 25 minutes and the heating was accomplished by passing the torch in proximity to the tube at a rate of about 20 passes per minute.

After driving off atmospheric impurities, the torch flame was adjusted to provide more heat. Only the metal was heated with the torch to a higher temperature in order to drive off adsorbed volatile impurities. This process took about 30 minutes. While the volatile impurities were being removed, pressure in chamber 20 increased and then subsided to the base pressure of about $10^{-7}$ Torr after removal of the volatile impurities was essentially completed. After removal of the volatile impurities, heating of the metal was discontinued and the tube was sealed off under vacuum by collapsing the tube at constriction section 26.

When heating the metal in order to remove volatile impurities, care was taken to heat the metal at a low enough temperature to prevent its volatilization, which would have been detectable by metallic film deposition on the inner walls of the tube.

The sealed tube 16 containing sample 12 in chamber 18 and metal 14 in chamber 20 with constriction section 24 unsealed so there is open communication between the chambers, was disposed horizontally. Sample 12 was manipulated into a position adjacent to constriction section 24 in which it was disposed with the cleaved surface facing upward. At this time, chamber 20 was heated with the torch to a high enough temperature to evaporate and cause migration of the calcium metal. Evaporation and migration of the calcium metal resulted in a bright metallic film on the surfaces of sample 12 (mainly on the upper surface), and also on many areas of the interior walls of tube 16.

Following coating of the sample with the metal, the sealed tube was transferred to an unheated 300 mm resistance heated tube furnace. In the furnace, the tube was located so that the sample was disposed at the center of the furnace near a position of zero temperature gradient and chamber 20 extended into the cooler region near the end of the tube furnace. The temperature control was set at 725° C. and the furnace was turned on. After about 20 minutes, the furnace reached its equilibrium temperature: sample temperature was about 725° C. and temperature at the end of chamber 20 was about 600° C. The furnace was held at this equilibrium temperature for about 70 minutes in order to permit diffusion of the calcium metal into the sample and the reduction reaction to proceed to form the divalent scandium.

Power to the furnace was then turned off and it was allowed to cool down to room temperature over a period of about 6 hours. Once the furnace cooled down to about room temperature, the sealed tube was removed, broken open, and the sample was removed from the tube. The sample was covered with a thin black layer which was removed by polishing. The origin and composition of the black layer on the sample is not known but it is believed to be associated with impurities in the quartz tube.

Analysis of this sample showed that about 5% of its original trivalent scandium had been converted to divalent scandium, as determined by EPR. The original crystal, prior to the conversion processing, contained no more than $7 \times 10^{19}$ scandium ions per cm$^3$, all of them in the trivalent state. After processing, it contained at least $3.3 \times 10^{18}$ divalent scandium ions per cm$^3$. The remainder of the scandium ions are presumed to have remained in the trivalent state. This sample was stable at room temperature for over one year and had a fluorescence profile shown in FIG. 2.

While presently preferred embodiments have been shown of the novel method for producing stable, high concentrations of divalent scandium in optically clear crystals, persons skilled in this art will readily appreciate that various additional changes and modifications may be made without departing from the spirit of the invention as defined and differentiated by the following claims.

What is claimed is:

1. A process comprising the steps of
   (a) evaporating and depositing an alkaline earth metal on a doped host by heating the alkaline earth metal at essentially vacuum to below 900° C., the host comprising an alkaline earth metal halide and the dopant being scandium trihalide wherein the scandium is trivalent;
   (b) heating under essentially vacuum to below 950° C. the doped host having the alkaline earth metal deposited thereon to diffuse the alkaline earth metal into the host and convert at least a fraction of the trivalent scandium to divalent scandium, duration of diffusion of the metal into the host and conversion of the trivalent scandium to divalent scandium is from a few minutes to two hours.

2. The process of claim 1 wherein step (b) includes heating the alkaline earth metal to a migration temperature of 500–700° C. and then heating the alkaline earth metal and the host to a diffusion and reaction temperature of 700–800° C.

3. The process of claim 1 wherein the host is a compound of an alkaline earth metal cation and a halide anion.

4. The process of claim 3 which includes the step of heating at a reduced pressure below atmospheric the doped host and the alkaline earth metal at a mildly elevated temperature above 20° C. to remove atmospheric impurities therefrom followed by the step of heating at the reduced pressure below atmospheric at an intermediate temperature above 150° C. to remove volatile impurities from the metal.

5. The process of claim 4 wherein the mildly elevated temperature is 50–200° C. and duration of removing the atmospheric impurities is from a few minutes to one hour; the intermediate temperature is 200–400° C. and duration of removing the volatile impurities is from a few minutes to one hour.

6. The process of claim 5 wherein the host is calcium difluoride, the dopant is scandium trifluoride, the metal is calcium, the reduced pressure is essentially vacuum, and conversion of the trivalent to divalent scandium is in excess of about $3 \times 10^{18}$ divalent scandium ions per cm$^3$.

7. The process of claim 5 wherein the reduced pressure is essentially vacuum and conversion of the trivalent to divalent scandium is above 1%.

8. The process of claim 1 wherein the host is calcium difluoride, the dopant is scandium trifluoride and the alkaline earth metal is calcium.

9. A process comprising the following steps:
   (a) placing a doped host into a first chamber, the host is an alkaline earth halide, the dopant is scandium trihalide, and amount of the dopant in the host is 0.05–3% based on the weight of the host and the dopant;
   (b) placing an alkaline earth metal into a second chamber, the first and the second chambers being in communication with each other;
   (c) evacuating the first and the second chambers so that pressure therein is reduced to a pressure below atmospheric;
   (d) heating the doped host, the alkaline earth metal and the first and second chambers for a period of less than two hours to a mildly elevated temperature above 20° C. to drive off atmospheric impurities from the doped host, the metal and the first and second chambers;
   (e) heating the alkaline earth metal to an intermediate temperature above 150° C. to drive off volatile impurities from the metal, as evidenced by increased pressure above the base reduced pressure until the pressure in the chambers returns to the base reduced pressure;
   (f) heating the alkaline earth metal to a migration temperature below 900° C. for a duration of less than two hours to cause the metal to vaporize, migrate and deposit on the doped host; and
   (g) heating the deposited alkaline earth metal to the diffusion and reaction temperature below 950° C. for a duration of less than two hours to diffuse the alkaline earth metal deposited on the doped host into the host and to cause formation of divalent scandium from the trivalent scandium in the host.

10. The process of claim 9 including the step of cooling the doped host following step (g) and the step of removing the cooled doped host from the first chamber.

11. The process of claim 10 wherein the mildly elevated temperature is 50–200° C. and duration thereof is from a few minutes to one hour, the intermediate temperature is 200–400° C. and duration thereof is from a few minutes to one hour, the migration temperature is 500–700° C. and duration thereof is from a few minutes to one hour, and the diffusion and reaction temperature is 700–800° C. and duration thereof is from a few minutes to two hours.

12. The process of claim 10 including the step of sealing the first and the second chambers from the atmosphere after step (d) and before step (f).

13. The process of claim 12 wherein the host is selected from the group consisting of alkaline earth fluorides, alkaline earth chlorides, colqurites, isomorphs of colquirites, and mixtures thereof.

14. The process of claim 12 wherein the host is selected from the group consisting of calcium fluoride, $LiCaIF_6$, $LiSrAlF_6$, $LiCaGa_6$, $LiSrGaF_6$, and mixtures thereof.

15. The process of claim 12 wherein the doped host is calcium fluoride doped with 0.5–1.5%, based on the weight of the doped host, of scandium trifluoride.

16. The process of claim 15 wherein the doped host is in the form of a crystal and wherein the doped host after step (g) contains more than 120 ppm of divalent scandium converted from the trivalent scandium in the doped host.

* * * * *